US006983187B2

(12) United States Patent
Kern

(10) Patent No.: US 6,983,187 B2
(45) Date of Patent: Jan. 3, 2006

(54) METHOD AND SYSTEM FOR AUTOMATICALLY GENERATING SELECTION CONDITIONS IN A PRODUCT CONFIGURATION SYSTEM

(75) Inventor: Thomas Kern, Nussloch (DE)

(73) Assignee: SAP Aktiengesellschaft, Walldorf (DE)

( * ) Notice: Subject to any disclaimer, the term of this patent is extended or adjusted under 35 U.S.C. 154(b) by 33 days.

(21) Appl. No.: 10/640,651

(22) Filed: Aug. 14, 2003

(65) Prior Publication Data
US 2005/0038542 A1    Feb. 17, 2005

(51) Int. Cl.
    *G06F 19/00*  (2006.01)
(52) U.S. Cl. .................... 700/97; 700/107; 709/919
(58) Field of Classification Search ............... 700/97, 700/105–107; 706/919, 921
See application file for complete search history.

(56) References Cited

U.S. PATENT DOCUMENTS

| 4,835,709 A | * | 5/1989 | Tsai ..................... 706/45 |
| 5,267,146 A | * | 11/1993 | Shimizu et al. .............. 703/1 |
| 5,311,424 A | * | 5/1994 | Mukherjee et al. .......... 705/29 |
| 5,555,406 A | * | 9/1996 | Nozawa ..................... 703/1 |
| 5,815,395 A | * | 9/1998 | Hart et al. ................ 700/110 |
| 6,223,094 B1 | * | 4/2001 | Muehleck et al. .......... 700/107 |
| 2002/0165701 A1 | | 11/2002 | Lichtenberg et al. |
| 2003/0149500 A1 | * | 8/2003 | Faruque et al. ............. 700/97 |
| 2003/0177114 A1 | * | 9/2003 | Lin et al. .................. 707/3 |
| 2004/0061715 A1 | * | 4/2004 | Chu et al. ................ 345/709 |
| 2004/0098151 A1 | * | 5/2004 | Carlucci et al. ............ 700/95 |
| 2004/0140976 A1 | * | 7/2004 | Callahan .................. 345/419 |
| 2005/0071146 A1 | * | 3/2005 | Kind ....................... 703/22 |

OTHER PUBLICATIONS

Wongvasu, N et al. "Representing the relationship between items in logical bill-of-material to support customers' requests for quotation for make-to-order products", Proceedings of the SPIE—The International Society for Optical Engineering SPIE—Int. Soc. Opt. Eng USA, vol. 4192, 2000, pp. 74-85, XP002307659 ISSN: 0277-786x.

Wongvasu, N et al. "Trie representation for expressing the compatibility between items in a logical bill of material structure", Proceedings of the SPIE—The International Society for Optical Engineering SPIE—Int. Soc. Opt. Eng USA, vol. 4565, 2001, pp. 84-90, XP002307762 ISSN: 0277-786X.

* cited by examiner

*Primary Examiner*—Zoila Cabrera
(74) *Attorney, Agent, or Firm*—Kenyon & Kenyon

(57) ABSTRACT

This disclosure relates to a method and system for automatically generating selection conditions associated with component variants represented in a hierarchical node structure in a product configuration system. The selection conditions relate to a determination of when component variants are to be included in a configurable product. The method and system may involve receiving relationship information for component variants at a first node level of the node structure, and determining what combinations may be formed from the component variants based on the relationship information. The method and system may further involve forming assembly variants corresponding to the combinations, at a second node level higher than the first node level, and forming selection conditions corresponding to the assembly variants based on selection conditions corresponding to the component variants.

17 Claims, 13 Drawing Sheets

METHOD AND SYSTEM FOR AUTOMATICALLY GENERATING SELECTION CONDITIONS IN A PRODUCT CONFIGURATION SYSTEM

FIELD OF THE INVENTION

Embodiments of the present invention relate generally to computer-based product configuration systems, and more particularly to a method and system for automatically generating selection conditions for components in a product being configured.

BACKGROUND INFORMATION

Computer software tools have become indispensable to managing the complexity entailed in designing and manufacturing many modern products. Automobiles are one example of such products.

One aspect of the complexity involved in the design and manufacture of an automobile is the great number and variability of its constituent parts. Typically an automobile model is assembled from a catalogue of parts according to a particular set of design specifications. Because of the number and variability of parts, it can be difficult for designers to ensure that the combinations of the parts are correct.

An approach that uses a computer-based system and associated software to help manage this aspect of complexity is described in U.S. Pat. No. 6,223,094 B1('094). As described in '094, a complex product such as an automobile may be represented in terms of a hierarchical data structure. A top or highest node of the data structure represents the end product (e.g., a compact car), while lower or subordinate nodes represent the components of the end product and associated production processes. A data structure of this kind, used in conjunction with, for example, a graphical user interface (GUI) with various different views tailored to specific user needs, helps to simplify design and production.

More specifically, the GUI may enable users, e.g., designers, to specify particular values for characteristics of a desired end product. The characteristics act to select particular variants of components of the end product. That is, a component may be represented in terms of its function within a product or as an abstraction of materials that may be used for the component, and there may be a number of possible variants associated with the component. The variants may be actual concrete realizations of the function or abstraction of the component: for example, one concrete realization of a component abstracted as a "seat" could be a leather, bucket seat, while another might a be a vinyl, bench-type seat. Based on the characteristics of a desired end product, only one of these realizations might be suitable for inclusion in the end product.

The foregoing is a very simple example; in actual practice, there may be hundreds or thousands of components and associated variants within a node hierarchy. Accordingly, there is a need to ensure that the selection of variants is correct: i.e., that it does not result, for example, in different variants being selected for the same component, or in incompatible components being combined. One way in which this need is addressed in the art is to provide user-defined "selection conditions" associated with component variants. A selection condition defines a set of conditions under which a particular variant of a component may be selected for inclusion into a product. A selection condition may take the form of a logical expression comprising operators that act on values specified for product characteristics.

In a design and manufacturing process for a complex product such as an automobile, such selection conditions are typically very numerous, and change frequently. Accordingly, it represents a significant cost in time and effort that, in known product design and manufacture systems, selection conditions are generated and maintained manually. That is, a user of such systems, such as a designer, must consider all the possible variants of a component that may go into a product, and design and manually encode all the corresponding selection conditions. Moreover, while the selection conditions may be relatively simple logical expressions for low-level, basic components, they may become inordinately complicated for higher-level assemblies of these basic components, since with each level upwards the number of theoretically possible combination increases.

In view of the foregoing considerations, it may be appreciated that generating selection conditions manually can be laborious and error-prone. Accordingly, an approach is needed to more efficiently generate selection conditions.

SUMMARY OF THE INVENTION

Embodiments of the present invention relate to a method and system for automatically generating selection conditions associated with variants represented in a hierarchical node structure in a product configuration system. According to the embodiments, relationship information for component variants at a first node level of the node structure may be provided in a relationship database. The relationship database may include relationship information concerning at least one of physical connections and functional relationships among the component variants. Based on the relationship information, it may be automatically determined what combinations may be formed from the component variants, and assembly variants corresponding to the combinations may be formed at a second node level higher than the first node level. Selection conditions corresponding to the assembly variants may be formed automatically, based on selection conditions corresponding to the component variants.

DETAILED DESCRIPTION

Figure 1:
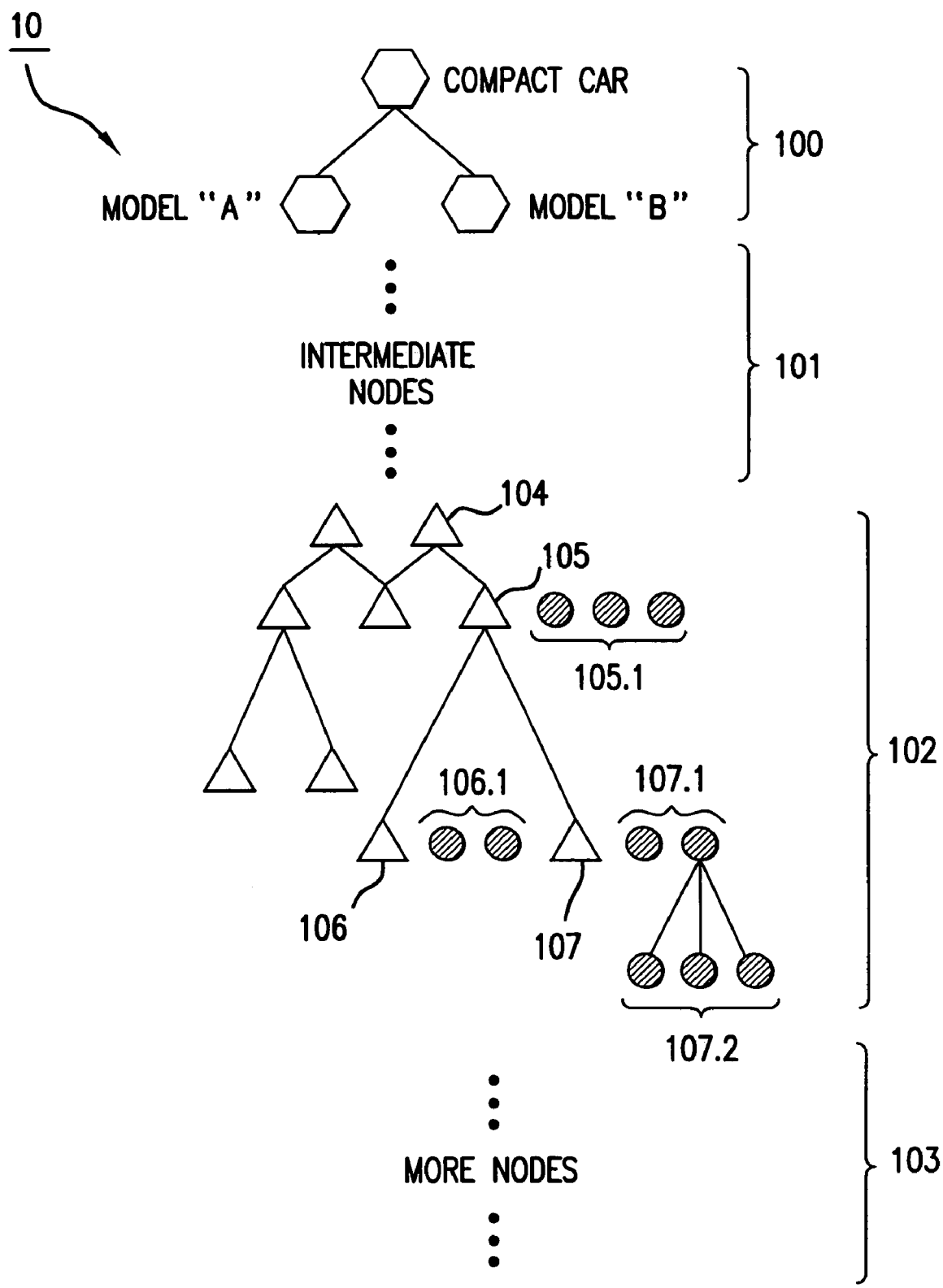
FIG. 1 shows an example of a hierarchical node structure according to embodiments of the present invention.

Embodiments of the present invention could be implemented as part of software for product design and manufacture as described above. In particular, embodiments of the present invention could be used in association with a product configuration system that uses a hierarchical data structure. FIG. 1 shows an example of a hierarchical data structure 10 corresponding to a "configurable product." "Configurable" here means, among other things, that by entering specific values for characteristics of an end product, an end product tailored to, for example, particular customers or markets may be defined. The configuring process may generate a list of components referred to as an "order bill of materials" (order BOM) that describes everything needed to produce a given end product according to some specific customer or production order. The overall structure of nodes and variants from which an order BOM may be configured may be referred to as a "super" BOM. The specific values for the characteristics could be entered, for example, via a GUI as described above, or some other form of user input.

Referring to FIG. 1, high-level nodes 100 include a top-level node that may represent an end product, such as a compact car, and high-level variants such as a model "A" and a model "B" of the compact car. The node structure 10 may further comprise intermediate nodes 101, not illustrated in detail, below the high level nodes 100. A structure of additional intermediate nodes 102, below nodes 101, is shown with some particularity as an illustrative example. The node structure 10 may further comprise still more nodes 103, not shown in detail, at a lower level.

As the node structure 10 is traversed from high-level nodes to low-level nodes, the nodes may be viewed as representing components of the end product at progressively finer levels of granularity. For example, node 104 could represent, generically, "an engine" while nodes 105–107 represent specific components of the engine and associated variants thereof. For example, node 105 could represent a specific engine component, and associated variants 105.1 could represent three different possible concrete realizations of that specific engine component. Along similar lines, nodes 106 and 107 could represent components of component 105, and associated variants 106.1 and 107.1, respectively. There could be variants of variants 107.2 in the node structure 10.

Figure 2:
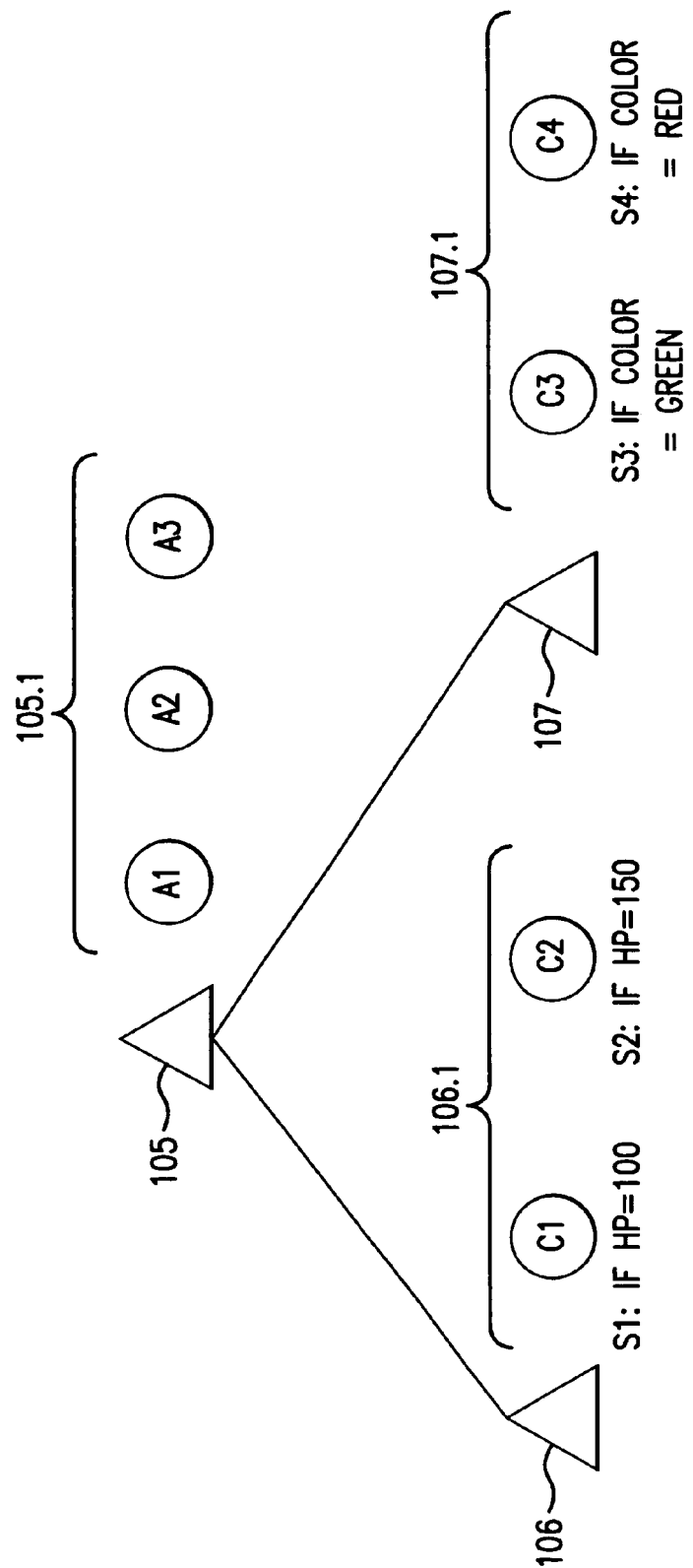
FIG. 2 shows a portion of the node structure of FIG. 1, including variants thereof and associated selection conditions.

Simply for purposes of illustrative example, the following discussion will refer to nodes 105, 106 and 107 and associated variants 105.1, 106.1 and 107.1. FIG. 2 shows a more detailed view of nodes 105–107: variants A1, A2 and A3 correspond to 105.1, variants C1 and C2 correspond to 106.1, and variants C3 and C4 correspond to 107.1. Variants A1, A2 and A3 represent three different possible concrete realizations for the component represented by node 105; variants C1 and C2 represent two different possible concrete realizations for the component represented by node 106; and variants C3 and C4 represent two different possible concrete realizations for the component represented by node 107.

Further, there are selection conditions S1, S2, S3 and S4 each respectively associated with variants C1, C2, C3 and C4. As described above, the selection conditions S1, S2, S3 and S4 are user-defined criteria for determining whether or not to allow a given variant to be included in an order bill of materials. For convenience, the selection conditions are illustrated as logical expressions, but the selection conditions could take other forms.

As further described earlier, a configuration of a product involves assigning specific values for characteristics of the product. Particular variants may then be selected based on the values specified, as they are applied to selection conditions. In FIG. 2, in the selection conditions, "HP" (horsepower) and "color" are characteristics; "100" and "150" are specific values that may be assigned to the HP characteristic, and "red" and "green" are specific values that may be assigned to the color characteristic. When, for a given selection condition, the operators linking the specific values assigned to the characteristics evaluate to logic "TRUE," a corresponding variant will be included in the bill of materials; otherwise, it will not be. For example, C1 may be the only suitable variant of component 106 based on the value assigned to the HP characteristic being 100, as required for selection condition S1 to evaluate to TRUE. On the other hand, C2 may be the only suitable variant of component 106 based on the value assigned to the HP characteristic being 150, as required for selection condition S2 to evaluate to TRUE. Similarly, C3 may be the only suitable variant of component 107 based on the value assigned to the color characteristic being "green," as required for selection condition S3 to evaluate to TRUE. C4 may be the only suitable variant of component 107 based on the value assigned to the color characteristic being "red," as required for selection condition S4 to evaluate to TRUE.

It may be appreciated in view of the foregoing example that, among other things, the selection conditions serve to prevent incompatible variants from being included in a design. For instance, if a product being designed is a car, designers want to ensure it has only one engine, of a certain type. The selection conditions help to ensure this. In particular, the selection conditions help to guarantee that at most one variant is selected for a component. Further, selection conditions help to guarantee that at least one variant is selected for a component. Consequently, the selection conditions help to ensure that incorrect production processes do not occur.

However, it should further be clear that if there are errors in the selection conditions, their beneficial function may be compromised. Moreover, the possibility of error in selection conditions increases as node levels become higher. Although at the level of nodes 106 and 107 in the example of FIG. 2, the selection conditions S1, S2, S3 and S4 are relatively simple logical expressions, at a higher node level, the selection conditions may need to become significantly more complicated, and thus more time-consuming and subject to error when manually encoded. A reason for this is apparent in FIG. 2. As noted earlier, nodes 106 and 107 represent components of node 105, and thus node 105 represents a combination or assembly of parts for which there may be a greater number of variants. Consequently, in order to differentiate among this greater number of possibilities, selection conditions must become more complex. For example, the higher-level selection conditions could require a plurality or concatenation of lower-level selection conditions. Moreover, at still higher levels of the node structure 10 than that illustrated in the example of FIG. 2, increasingly complicated structures representing sub-assemblies of many parts would typically be encountered. Manually generating selection conditions for such high level nodes may in fact become prohibitively difficult.

Accordingly, with the foregoing example in mind, a description will now be given of embodiments of a method and system according to the present invention for automatically generating selection conditions, to avoid the labor and possibility of error entailed in manually encoding selection conditions. According to the embodiments, a set of selection conditions corresponding to variants at a first node level may be provided. The first node level may comprise a plurality of nodes corresponding to components of a higher-level assembly node. Relationship information concerning relationships among variants at the first node level may be obtained from a relationship database. Using the selection conditions and the relationship information, variants and corresponding selection conditions at the assembly node level may be automatically created.

Figure 3:
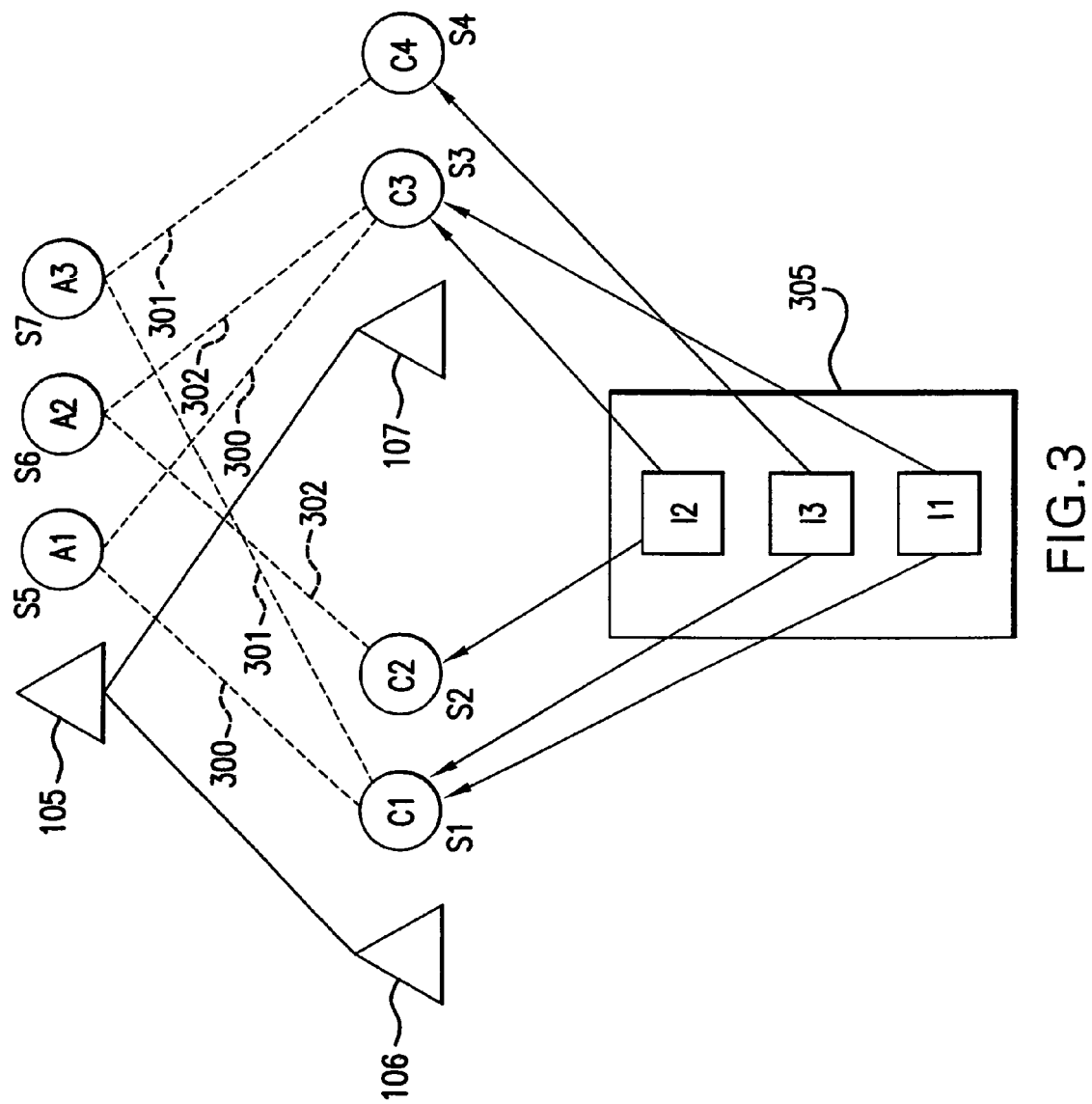
FIG. 3 illustrates relationship information concerning the node structure of FIG. 2, according to embodiments of the present invention.

FIG. 3 shows another view of the nodes discussed in connection with FIG. 2, this time including relationship information according to embodiments of the present invention. In FIG. 3, broken lines 300 illustrate a relationship between variant C1 of node 106 and variant C3 of node 107, and variant A1 of node 105. Similarly, broken lines 302 illustrate a relationship between variant C2 of node 106 and variant C3 of node 107, and variant A2 of node 105. Broken lines 301 illustrate a relationship between variant C1 of node 106 and variant C4 of node 106, and variant A3 of node 105. Referring to variants C1, C3 and A1, the relationship information could relate, for example, to a physical connection between the parts represented by component variants C1 and C3 to form an assembly variant A1; the relationship information could also concern some other functional relationship, and not necessarily a physical connection. Similarly, for variants C2, C3 and A2, and C1, C4 and A3, respectively, the relationship information could relate to a physical connection or some other functional relationship.

According to embodiments of the invention, relationship information represented by broken lines 300, 301 and 302 could be obtained from a relationship database 305. Such a relationship database could, for example, contain detailed engineering information about parts and sub-assemblies of parts of a product. An example of such a database is a CAD (computer-aided design) engineering database. CAD engineering systems are used to design the specific parts and assemblies that go into a product. However, though typically CAD systems and product configuration systems as described above are present in the same design and manufacturing facilities, they are not known in the art to be linked to or to communicate with each other. One reason for this is that a product configuration system as described above is typically more concerned with processes involving selecting and assembling parts that go into a product than with the actual engineering details of the parts and assemblies. By contrast, a CAD system typically includes detailed engineering information about parts and assemblies, such as dimensions, interconnections, functional relationships, and the like.

The relationship information may be evaluated to determine what possible combinations of lower-level variants may exist at the assembly level. For each possible combination, a new variant and a corresponding selection condition may be formed. In FIG. 3, I1 represents relationship information in the database 305 corresponding to broken lines 300; specifically, for example, I1 may specify that variants C1 and C3 may be physically connected. Similarly, I2 represents relationship information in the database 305 corresponding to broken lines 302; for example, I2 may specify that variants C2 and C3 may be physically connected. I3 represents relationship information in the database 305 corresponding to broken lines 301, and may specify that variants C1 and C4 may be physically connected. According to embodiments of the present invention, using the relationship information concerning the variants at the level of nodes 106 and 107, and their corresponding selection conditions, variants at the higher-level, assembly node 105 may be automatically generated or formed. For example, given the relationship information that connections between C1 and C3, C1 and C4, and C2 and C3 are possible, it follows that at least three variants A1, A2 and A3 may exist at the assembly-level node, 105.

Further, given that selection conditions are known for the variants at the lower level nodes, selection conditions may be automatically generated or formed for combinations of the variants at the assembly-level node. The selection conditions for the variants at the assembly-level node may be formed by combining or linking selection conditions of the lower-level variants. According to embodiments, the combining might be done by linking the selection conditions with the Boolean AND operator.

For example, given that selection conditions S1 and S3 are known for the lower level nodes 106 and 107, it follows that a selection condition S5 for assembly A1 could be "IF HP=100 AND color=green" (i.e., if the value assigned to the HP characteristic is "100", and the value assigned to the color characteristic is "green", then select variant A1 for inclusion into the product). Similarly, given S1 and S3, it follows that a selection condition S6 for assembly A2 could be "IF HP=150 AND color=green"; and that given S1 and S4, a selection condition S7 for assembly A3 could be "IF HP=100 AND color=red".

Further information may be derived from the relationship information I1, I2, I3. For example, there are four possible combinations of the variants of nodes 106 and 107: C1 and C3; C1 and C4; C2 and C3; and C2 and C4. The fact that the relationship information obtained from the database 305 does not indicate any relationship between variants C2 and C4 may provide the basis for placing a restriction on the combination HP=150 AND color=red for any variant of node 105. That is, no variant should be created for this combination, and no selection condition should allow this combination.

Figure 4:
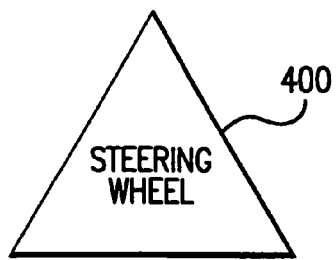
FIGS. 4–10 illustrate an example of automatically generating variants and corresponding selection conditions according to embodiments of the present invention.

FIGS. 4–10 illustrate another example of automatically generating selection conditions according to embodiments of the invention. FIG. 4 shows a "steering wheel" node 400 such as could be included in a hierarchical node structure 10 as shown in FIG. 1. Typically, a steering wheel is an assembly of parts, comprising, for example, an outer ring, spokes and a middle part. The middle part might itself be an assembly, comprising, for example, an airbag and a casing for the airbag. The following example relates to how a group of nodes and associated variants and selection conditions representing such parts might be processed according to embodiments of the invention to ultimately form variants and corresponding selection conditions for the node 400 representing the steering wheel assembly. Assume, for purposes of illustration, that a characteristic "steering wheel type" may be assigned the values "standard" or "leather-covered", and that this characteristic and these values will at least partly determine what variants will be created for the steering wheel node.

Figure 5:
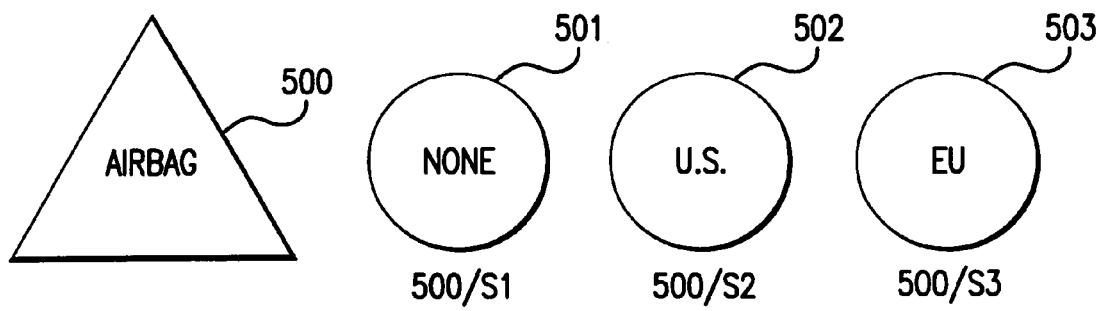
Figure 6:
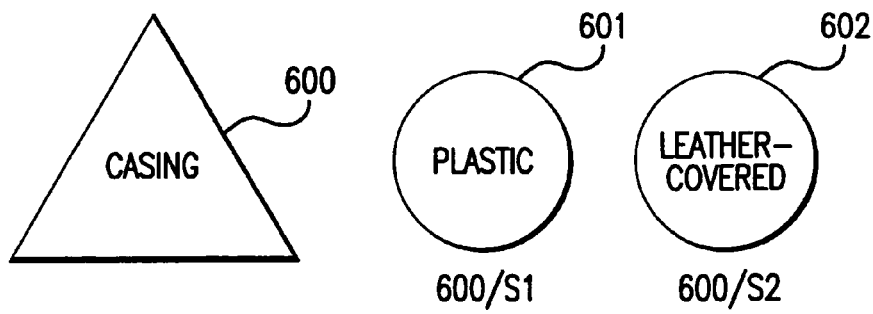

Components and associated variants of the steering wheel assembly are shown in FIGS. 5 and 6. As shown in FIG. 5, an airbag node 500 may have variants 501, 502 and 503, representing, respectively, no airbag, a U.S.-style airbag, and a European-style airbag. Each variant has a selection condition associated therewith. For variant 501, the selection condition is 500/S1: IF country=China (i.e., if the characteristic "country" is assigned the value "China", select this variant); for variant 502, the selection condition is 500/S2: IF country=U.S. (i.e., if the characteristic "country" is assigned the value "U.S.", select this variant); and for variant 503, the selection condition is 500/S3: IF country=Germany (i.e., if the characteristic "country" is assigned the value "Germany", select this variant).

As shown in FIG. 6, a casing node 600 may have variants 601 (a plastic casing) and 602 (a leather-covered casing). Each variant has a selection condition associated therewith. For variant 601, the selection condition is 600/S1: IF steering wheel type=standard (i.e., if the characteristic "steering wheel type" has the value "standard", select this variant); for variant 602, the selection condition is 600/S2: IF steering wheel type=leather (i.e., if the characteristic "steering wheel type" has the value "leather", select this variant).

Figure 7:
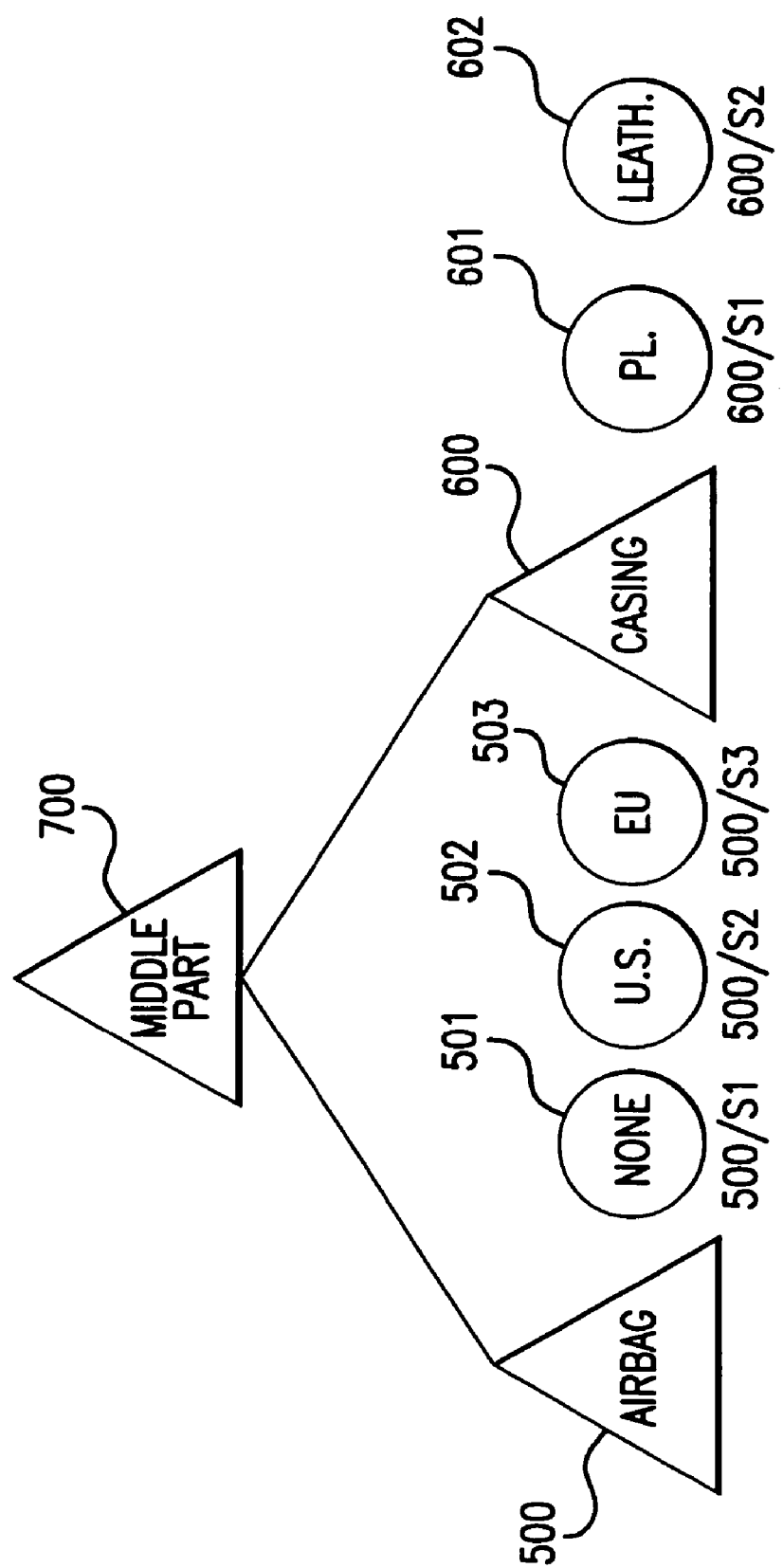
Figure 8:
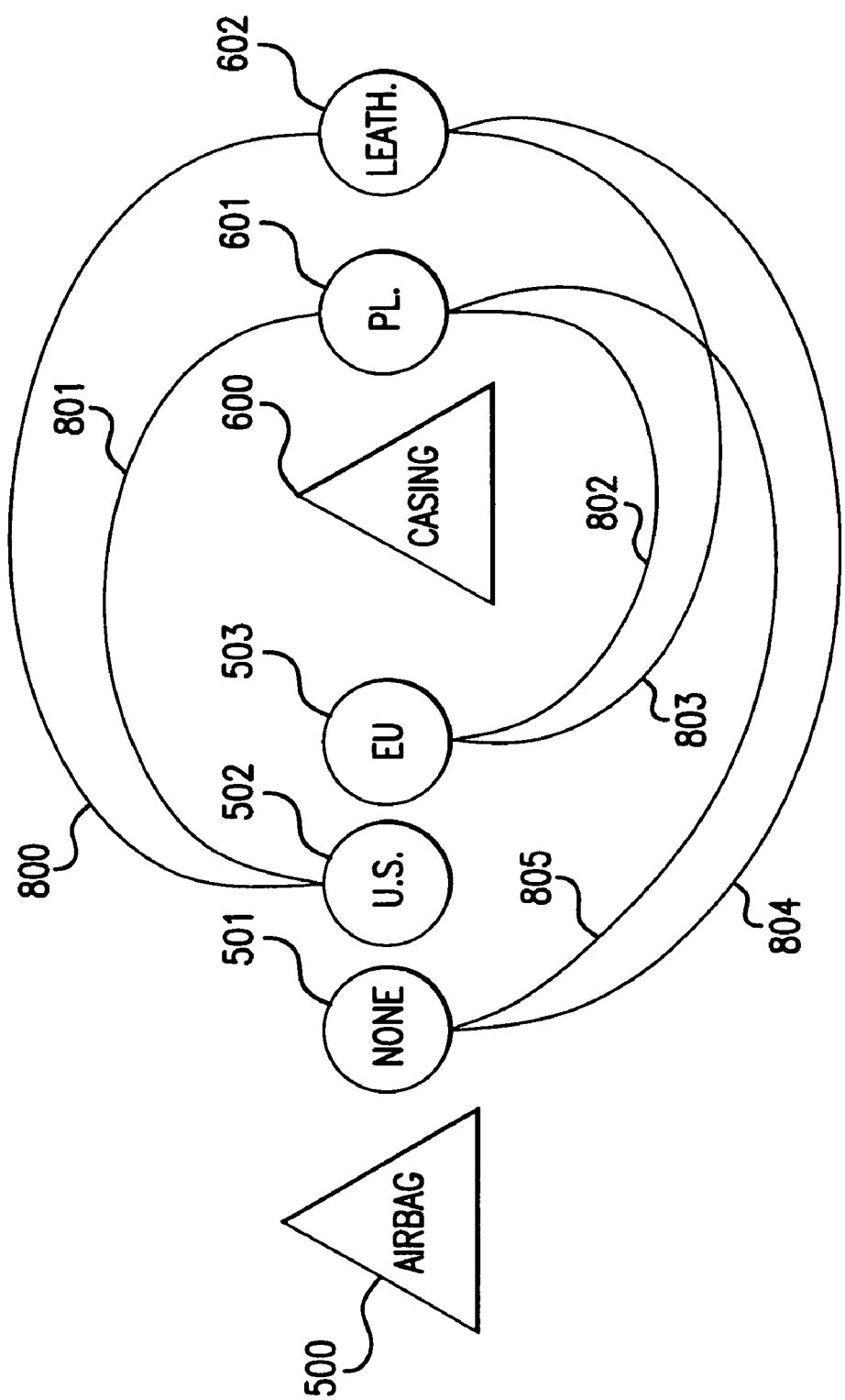

Given the foregoing nodes and associated variants, a structure as shown in FIG. 7 might be maintained by the product configuration system, where node 700 represents a "middle part" assembly of the airbag and the casing. However, variants and selection conditions still need to be defined for node 700. In the prior art, this would have been done manually: that is, a designer would have needed to spend time considering what were the possible combinations at the node 700 level, and creating corresponding variants and selection conditions for these. However, according to embodiments of the present invention as discussed above, relationship information for the lower-level (nodes 500 and 600) variants may obtained from a relationship database, for example, an engineering database such as would be part of a typical CAD system. The relationship database may include relationship information concerning relationships (connections, functional relationships, and the like) between all variants of the casing 600 (plastic; leather-covered) and all variants of the airbag 500 (none; U.S.-style; European-style). For example, the relationship information might be as shown in FIG. 8, where lines 800–805 represent a physical connection or functional relationship between elements. More specifically, lines 800 and 801 indicate that a U.S.-style airbag could be enclosed in either a plastic casing or a leather-covered casing, as indicated; similarly, lines 802 and 803 indicate that a European-style airbag could be enclosed in either a plastic casing or a leather-covered casing; and if there is no airbag (i.e., there is simply a placeholder) the middle casing could be either plastic or leather-covered, as indicated by lines 804 and 805.

Figure 9:
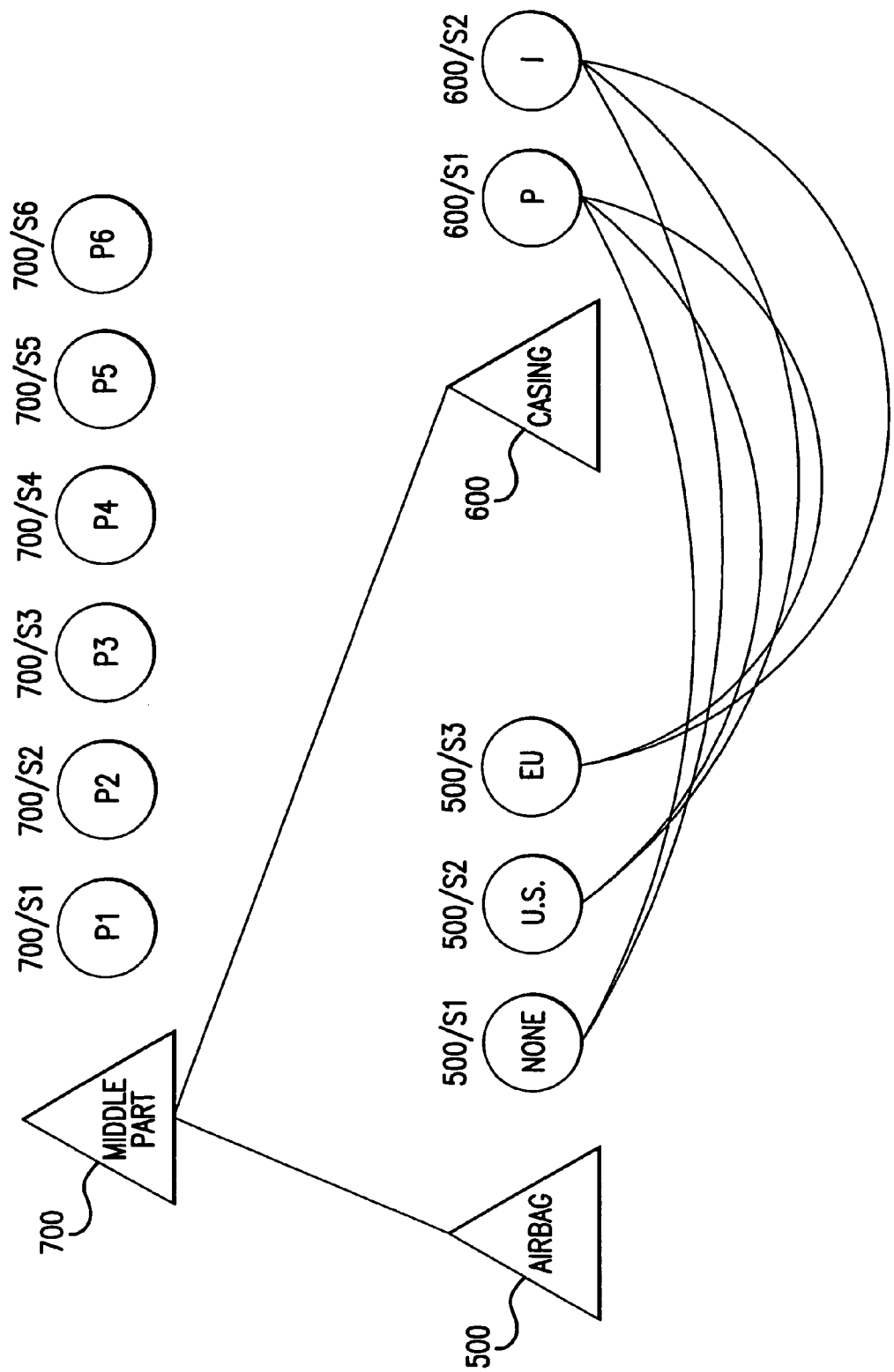

Given the selection conditions at the lower-level nodes 500 and 600 and the relationship information of FIG. 8, selection conditions may be automatically generated for the higher-level assembly node 700, according to embodiments of the present invention. More specifically, the relationship information may be evaluated to determine what possible combinations of lower-level variants may exist at the assembly level. For each possible combination, a new variant and a corresponding selection condition may be formed. In particular, selection conditions for the new variants at the assembly level may be formed by combining or concatenating selection conditions defined for the lower level. This is illustrated in FIG. 9. Because the relationship information indicates that there are 6 possible relationships among the variants at the level of nodes 500 and 600, 6 variants (P1–P6) have been created at the higher, assembly level: i.e., the node 700 or middle-part node level. The 6 variants are P1: plastic casing without airbag; P2: plastic casing with U.S.-style airbag; P3: plastic casing with European-style airbag; P4: leather-covered casing with no airbag; P5: leather-covered casing with U.S.-style airbag; and P6: leather-covered casing with European-style airbag.

Corresponding selection conditions 700/S1–S6 have been generated by concatenating the lower-level selection conditions. More specifically, the lower-level selection conditions have been linked with logical AND operators. Thus, for variant P1 the selection condition 700/S1 is: IF steering wheel type=standard AND country=China; for variant P2 the selection condition 700/S2 is: IF steering wheel type=standard AND country=U.S.; for variant P3 the selection condition 700/S3 is: IF steering wheel type=standard AND country=Germany; for variant P4 the selection condition 700/S4 is: IF steering wheel type=leather AND country=China; for variant P5 the selection condition 700/S5 is: IF steering wheel type=leather AND country=U.S.; and for variant P6 the selection condition 700/S6 is: IF steering wheel type=leather AND country=Germany.

Figure 10:
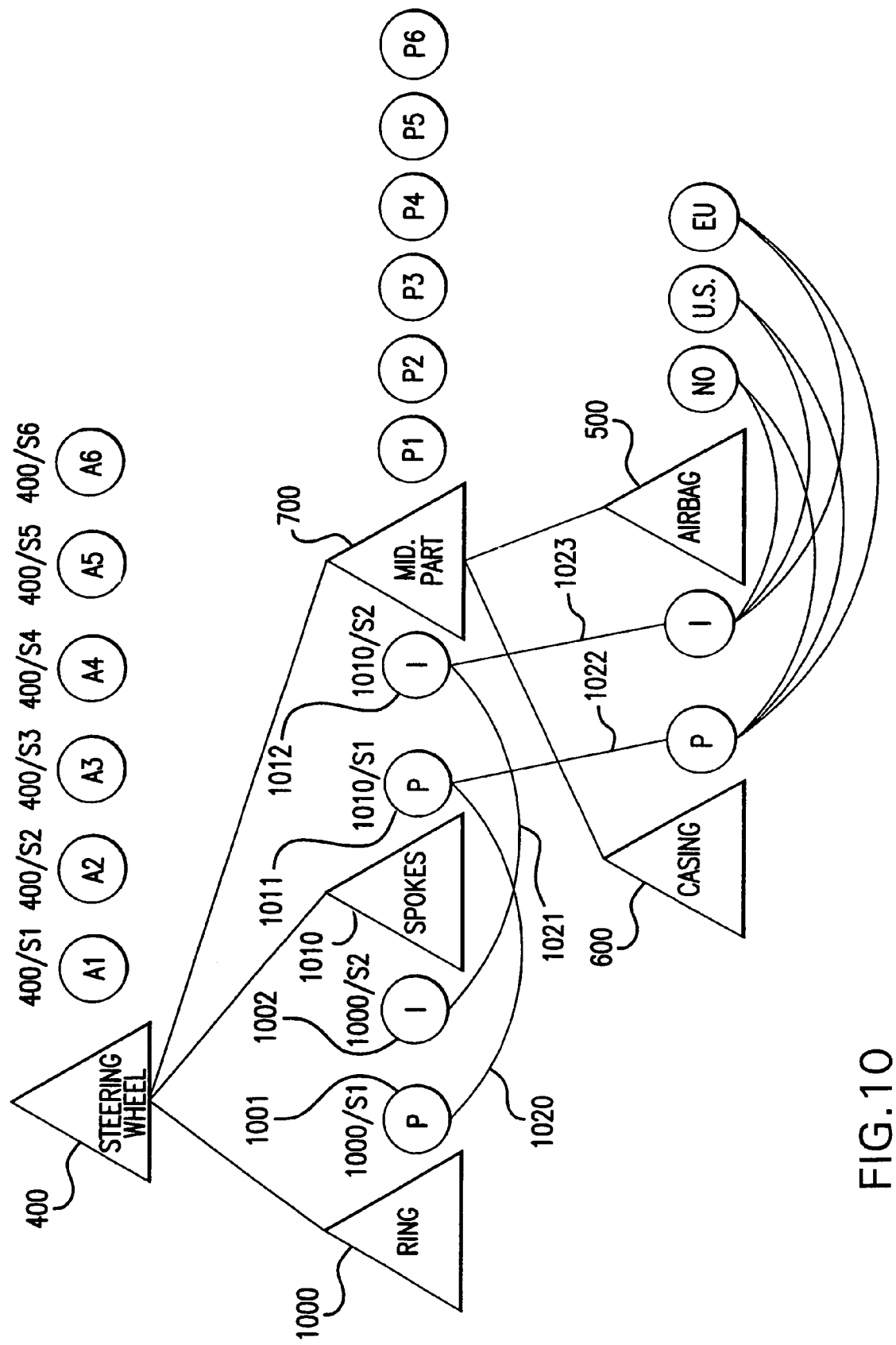

Selection conditions for the steering wheel node 400 mentioned earlier may now be readily generated, using the variants and associated selection conditions generated for the middle part node, 700. This is illustrated in FIG. 10. In FIG. 10, a node 1000 representing the outer ring component of the steering wheel 400, and a node 1010 representing the spokes connecting the outer ring and the middle part are shown, in addition to the middle part node 700. The ring node 1000 has associated variants 1001 (plastic) and 1002 (leather-covered). The spokes node 1010 has variants 1011 (plastic) and 1012 (leather-covered). Each variant has a selection condition associated therewith. For variants 1001 and 1011, the selection conditions are respectively 1000/S1 and 1010/S1, which are the same: IF=steering wheel type=standard; for variants 1002 and 1012, the selection conditions are respectively 1000/S2 and 1010/S2, which are the same: IF steering wheel type=leather.

Suppose that the relationship information for nodes 1000 and 1010 is that a plastic outer ring may only be connected to plastic spokes, and that a leather-covered outer ring may only be connected to leather-covered spokes. This is indicated by lines 1020 and 1021, respectively. Further suppose that the relationship information for nodes 1010 and node 600 (the casing of the middle part) is that plastic spokes may only be connected to a plastic casing, and that leather-covered spokes may only be connected to a leather-covered casing, as indicated by lines 1022 and 1023, respectively.

Using the selection conditions for the lower level nodes and the relationship information for the variants, the variants and associated selection conditions for the steering wheel assembly node 400 may now be automatically created. While at first glance, it would appear that there could be at least 24 variants for the steering wheel assembly (2 variants for the outer ring, times 2 variants for the spokes, times 6 variants for the middle part=24), the relationship information simplifies the calculation. The relationship information specifies that parts that are plastic are only connected to other parts that are plastic, and that parts that are leather-covered are only connected with other parts that are leather-covered. Absent this information, a person trying to manually perform the task of generating selection conditions for the steering wheel assembly might try to include variants having combinations of plastic and leather-covered parts. This could result in selection conditions that permit two or more variants to be selected for the steering wheel assembly, which, as noted earlier, is something that the selection conditions are intended to prevent.

However, given the relationship information, only 6 variants need to be created for the steering wheel assembly node. The variants are A1: plastic outer ring, plastic spokes, plastic casing without airbag; A2: plastic outer ring, plastic spokes, plastic casing with U.S.-style airbag; A3: plastic outer ring, plastic spokes, plastic casing with European-style airbag; A4: leather-covered outer ring, leather-covered spokes, leather-covered casing with no airbag; A5: leather-covered outer ring, leather-covered spokes, leather-covered casing with U.S.-style airbag; and A6: leather-covered outer ring, leather-covered spokes, leather-covered casing with European-style airbag. The corresponding selection conditions may be generated by concatenating the respective selection conditions of the lower-level variants. Thus, for example, the selection condition 400/S1 for variant A1 (by a straightforward concatenation) is: (IF steering wheel type=standard) AND (IF steering wheel type=standard) AND (IF steering wheel type=standard) AND (IF country=China); this simplifies to 400/S1: IF steering wheel type=standard AND country=China.

Similarly, selection condition 400/S2 for variant A2 is: IF steering wheel type=standard AND country=U.S.; selection condition 400/S3 for variant A3 is: IF steering wheel type=standard AND country=Germany; selection condition 400/S4 for variant A4 is: IF steering wheel type=leather AND country=China; selection condition 400/S5 for variant A5 is: IF steering wheel type=leather AND country=U.S; and selection condition 400/S6 for variant A6 is: IF steering wheel type=standard AND country=Germany.

Thus, FIG. 10 shows the overall node structure for the steering wheel assembly. Clearly, the automatic generation of variants and of corresponding selection conditions may be carried on to arbitrarily higher levels using the same techniques as discussed above.

Figure 11:
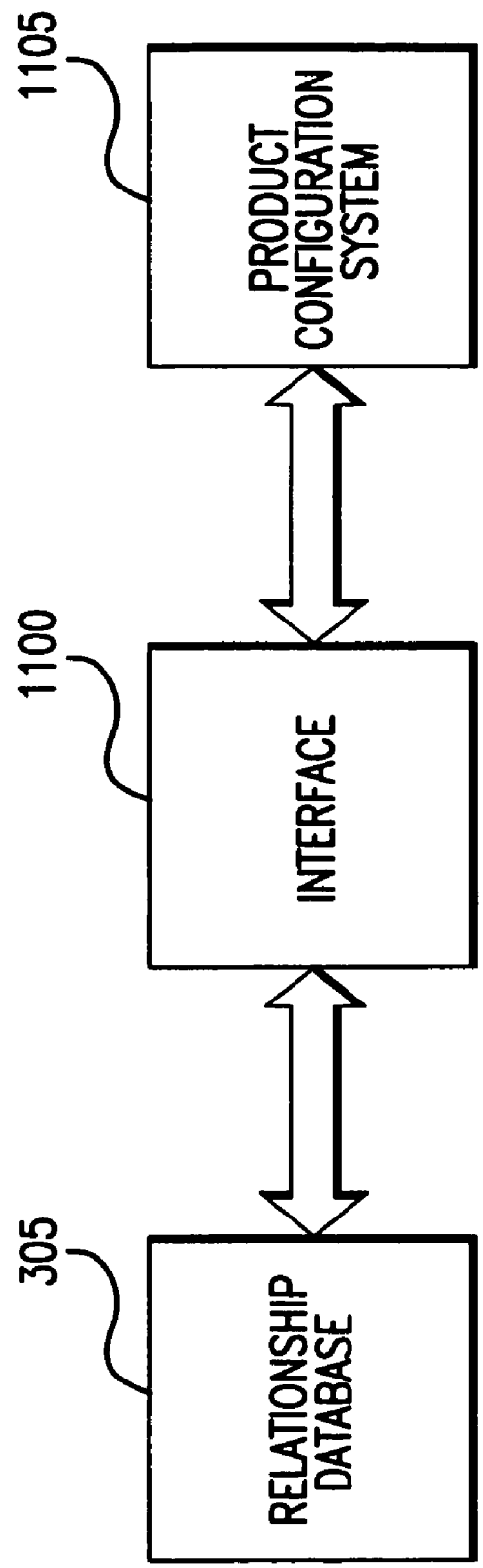
FIG. 11 shows communication via an interface between a product configuration system and a relationship database according to embodiments of the present invention.

Embodiments of the present invention may provide for communication between a relationship database and a product configuration system, whereby the product configuration system may receive relationship information in order to automatically generate new variants and selection conditions as described above. FIG. 11 illustrates communication between such a relationship database 305 and a product configuration system 1105. The product configuration system 1105 may communicate with the relationship database 305 via a suitable interface 1100. The relationship database 305, as mentioned above, could be part of a CAD system, and the interface 1100 may, for example, comprise physical and logical components adapted to process CAD engineering data to place it into a form usable by the product configuration system 1105.

Figure 12:
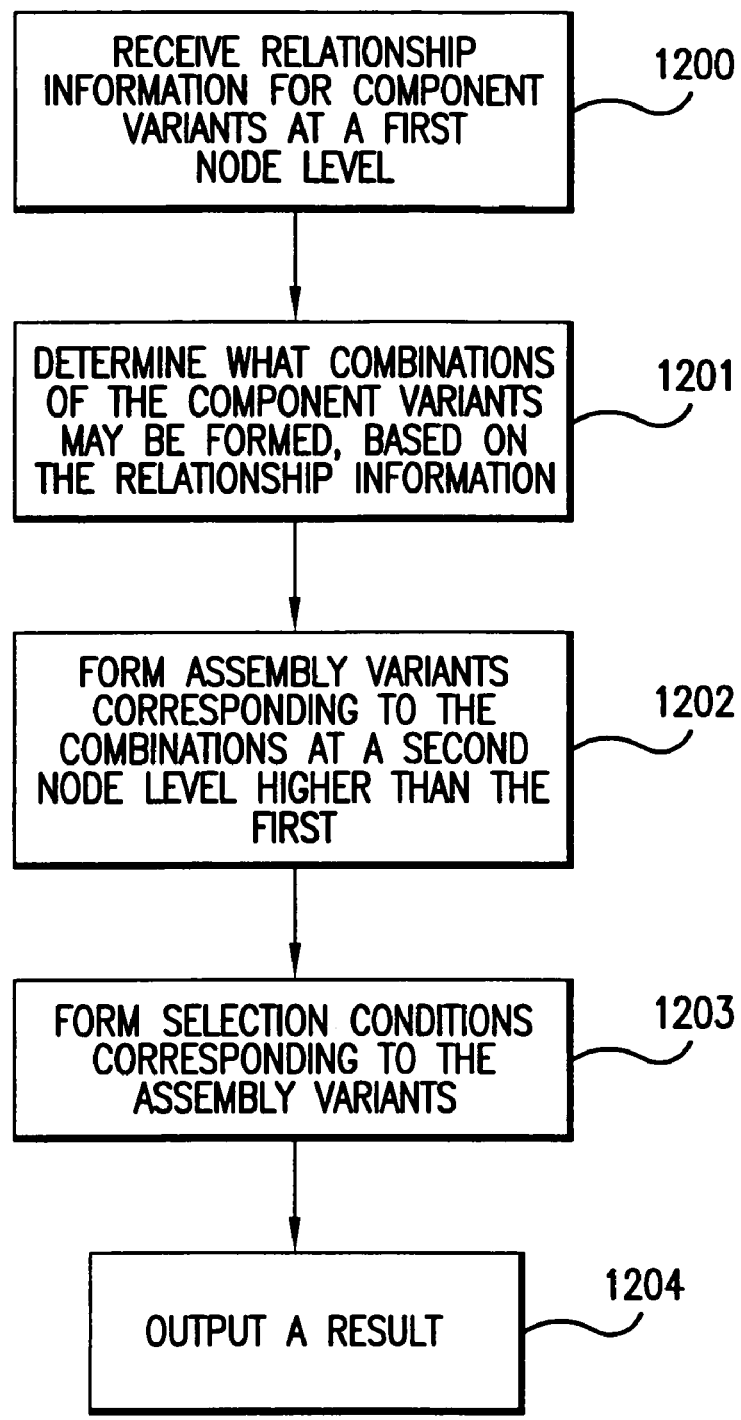
FIG. 12 shows a flowchart illustrating a method according to embodiments of the invention.

A user might apply embodiments of the invention using a GUI, for example, adapted to interface with the product configuration system. Via the GUI, the user could provide a set of initial selection conditions at low level nodes, and then invoke, via the GUI, software implementing embodiments of a method according to the present invention to automatically generate variants and corresponding selection conditions to an arbitrarily higher level of nodes. Such a method is illustrated in flowchart form in FIG. 12. As shown in block 1200, a software implementation according to embodiments of the invention, upon invocation thereof by a user, could receive relationship information for component variants at a first node level of the node structure. The relationship information could be provided in a relationship database such as 305, and communicated to the software implementation via an interface such as interface 1200. Then, as shown in block 1201, it may be automatically determined what combinations may be formed from the component variants, based on the relationship information. Assembly variants corresponding to the combinations may be automatically formed, at a second node level higher than the first node level; block 1202. As shown in block 1203, selection conditions corresponding to the assembly variants may be automatically formed, based on selection conditions corresponding to the component variants. Results, such as a graphical display or printout of newly-formed variants and corresponding selection conditions, could be output to a user; block 1204.

Figure 13:
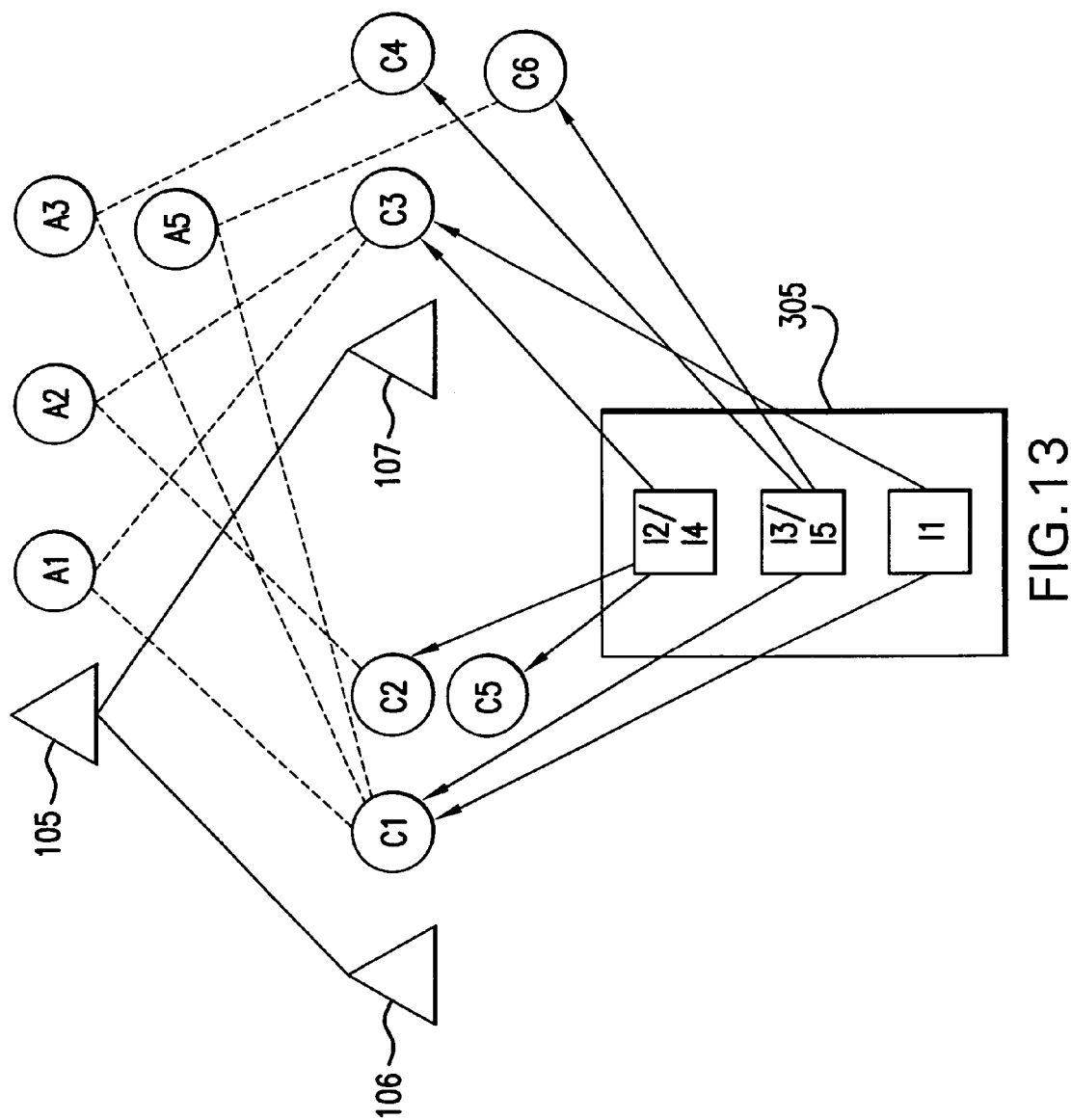
FIG. 13 shows relationship information associated with the replacement of variants within the node structure shown in FIG. 2.

Embodiments of the present invention could further be adapted to account for new parts being introduced into a product or sub-assembly, for example to replace older parts. FIG. 13 illustrates such a situation, referring to the node structure first discussed in connection with FIGS. 2 and 3. In FIG. 13, assume variant C5, corresponding to a new part, has been introduced to replace variant C2 at node 106, and that variant C6, corresponding to a new part, has been introduced to replace variant C4 at node 107. Further assume that information I5 in database 305 is "change" information that, in addition to indicating that variant C1 may be physically connected with new variant C6, includes the information that variants C4 and C6 are not compatible: i.e., among other things, not interchangeable for purposes of being made part of a higher-level assembly. Assume that information I4 in database 305 is change information that, in addition to indicating that variant C3 may be physically connected with new variant C5, includes the information that variants C2 and C5 are compatible: i.e., among other things, interchangeable for purposes of being made part of a higher-level assembly.

Embodiments of the invention may evaluate the compatibility information represented by I4 and I5 to determine whether a new variant needs to be created at the higher-level node. For example, given I4, a new variant need not be created for the combination of C3 and C5 at the level of node 105, since C2 and C5 are compatible (interchangeable for purposes of being combined with C3 to form assembly A2). On the other hand, a new variant A5 needs to be created at the node 105 level, representing the combination of C1 and C6, since C4 and C6 are not compatible (not interchangeable for purposes of being combined with C1 to form assembly A3). Given selection conditions for new variants C5 and C6, corresponding selection conditions could be automatically generated for assemblies A2 and A5, along the lines discussed previously.

It may be appreciated that, by exploiting compatibility information as described above, an undesirable "explosion" in the number of new variants created at higher-level nodes, due to a minor change at the lowest level, may be prevented.

Additionally, embodiments of the invention may operate in association with a "change number" to automatically propagate change information, such as I4 and I5 above, from level to level. The change number may indicate what component is being replaced, and where. For example, a replacement component and a component of a higher-level assembly to which it is to be connected may have a common change number. The change number may further be associated with an effective date and/or time of the change. Embodiments of the invention may operate to automatically propagate the change number and effective date/time for affected components from a low level to higher levels during a product configuration process. This may ensure that all required changes at all corresponding levels are registered within the product configuration system at the correct date/time.

Figure 14:
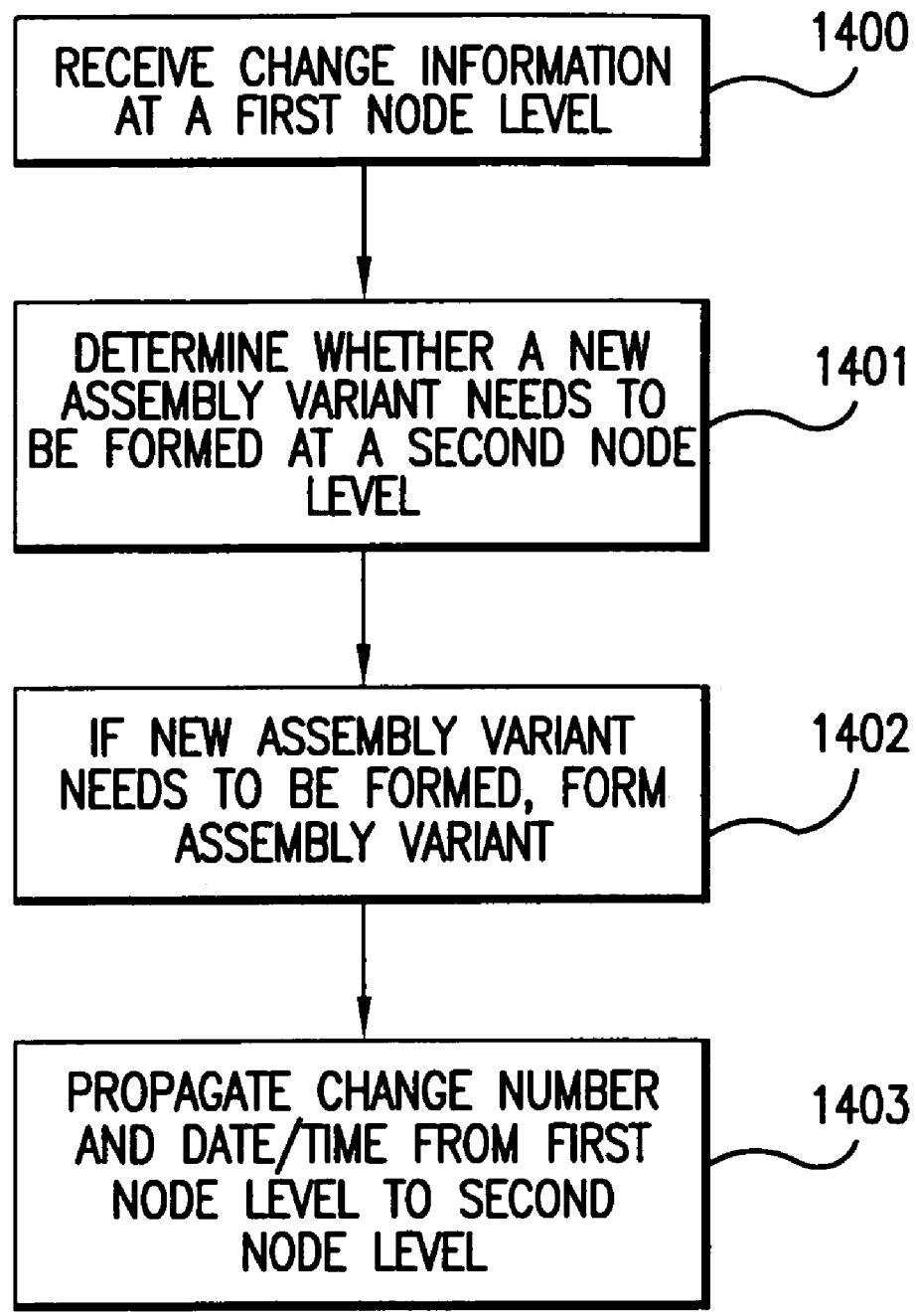
FIG. 14 shows a flowchart illustrating a method according to embodiments of the invention.

In view of the above, FIG. 14 is a flowchart illustrating the automatic propagation of change information associated with variants represented in a hierarchical node structure in a product configuration system, according to embodiments of the invention. As shown in block 1400, the method may include receiving change information for component variants at a first node level of the node structure, for example from relationship database 305. The change information may relate to a replacement of a first component variant with a second component variant, and include information relating to compatibility of the first component variant with the second component variant. Based on the compatibility information, it may be determined whether a new assembly variant corresponding to the second component variant needs to be formed, at a second node level higher than the first node level; block 1401. More specifically, if the compatibility information indicates that the second component variant is not interchangeable with the first component variant, a new assembly variant corresponding to the second component variant may be formed at the second node level; block 1402. On the other hand, it may be determined, if the first component variant and the second component variant are compatible, that a new assembly variant corresponding to the second variant need not be created. Embodiments of the invention may further comprise propagating a change number that correlates the second component variant with a corresponding component variant in the new assembly variant, and a change date and/or time specifying when the replacement becomes effective, from the first node level to the second node level; block 1403.

Figure 15:
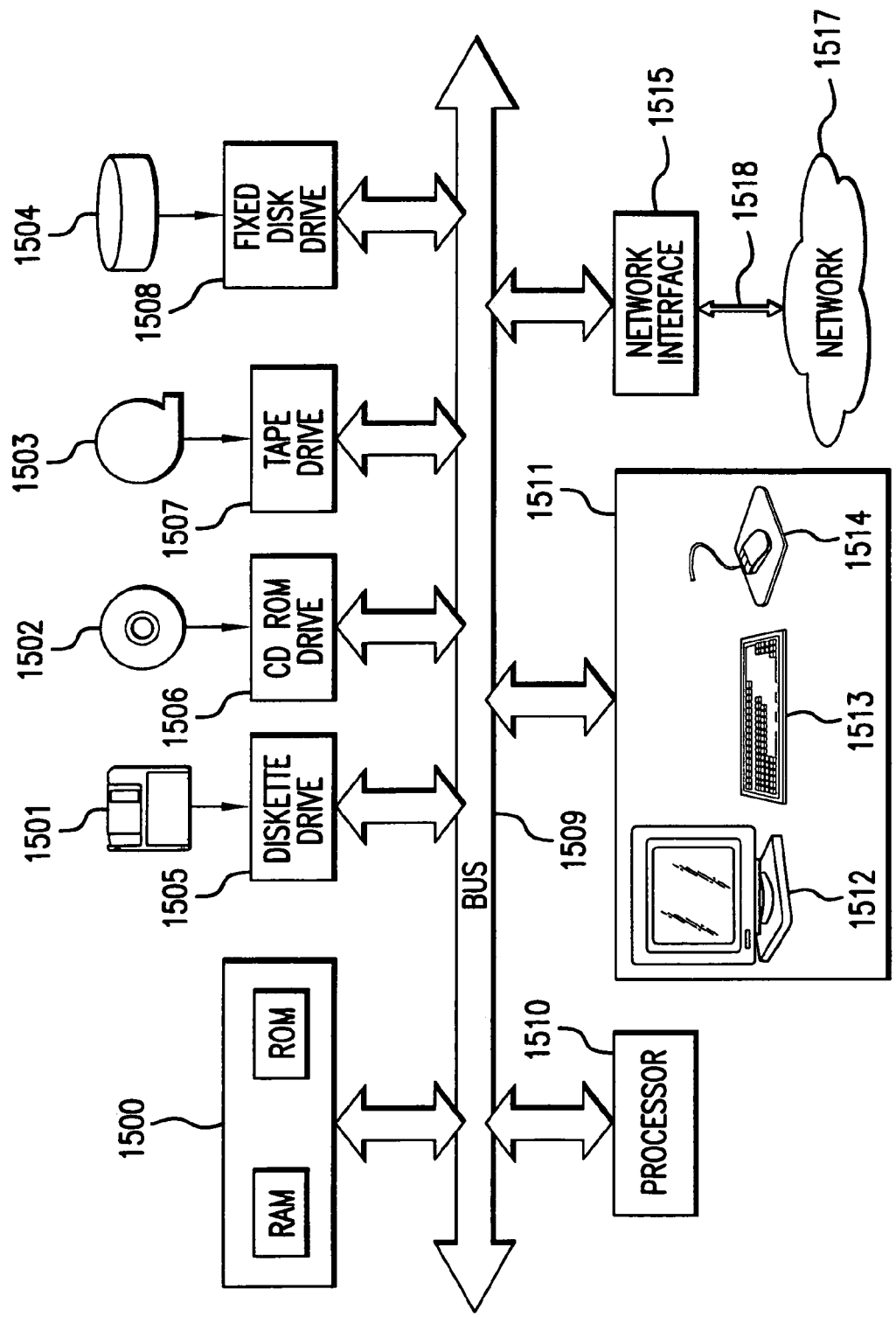
FIG. 15 shows a computer system for implementing embodiments of the invention.

FIG. 15 shows a high-level representation of a computer system for implementing embodiments of the present invention, such as might be realized by a variety of known and commercially available hardware and software elements. The system comprises a memory 1500 including ROM and RAM, processor 1510 and user interface 1511 comprising a video display 1512, keyboard 1513 and mouse 1514. Elements may communicate via system bus 1509. The system may further comprise a network 1517 connected by a network medium 1518 and network interface 1515.

A computer program or collection of programs comprising computer-executable instructions for performing a method according to embodiments of the present invention may be stored and transported on computer-usable media such as diskette 1501, CD-ROM 1502, magnetic tape 1503 and fixed disk 1504. To perform the embodiments, computer instructions may be retrieved from the computer-usable media 1501–1504 using their respective drives 1505–1508 into memory 1500, and executed by a processor 1510. The functionality disclosed hereinabove for performing the embodiments may find specific implementations in a variety of forms, which are considered to be within the abilities of a programmer of ordinary skill in the art after having reviewed the specification.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A method for generating selection conditions associated with variants represented in a hierarchical node structure in a product configuration system, the selection conditions relating to a determination of when the variants are to be included in a configurable product, the method comprising:
   (a) receiving relationship information for component variants at a first node level of the node structure;
   (b) determining what combinations may be formed from the component variants based on the relationship information;
   (c) forming assembly variants corresponding to the combinations, at a second node level higher than the first node level; and
   (d) automatically forming selection conditions corresponding to the assembly variants based on selection conditions corresponding to the component variants.

2. The method of claim 1, wherein the relationship information is provided in a computer-aided design engineering database.

3. The method of claim 1, wherein (d) comprises combining the selection conditions corresponding to the component variants.

4. A method for automatically generating selection conditions associated with variants represented in a hierarchical node structure in a product configuration system, the selection conditions relating to a determination of when the variants are to be included in a configurable product, the method comprising:
   (a) receiving relationship information for component variants at a first node level of the node structure;
   (b) determining what combinations may be formed from the component variants based on the relationship information;
   (c) forming assembly variants corresponding to the combinations, at a second node level higher than the first node level; and
   (d) forming selection conditions corresponding to the assembly variants based on selection conditions corresponding to the component variants;
   wherein (b) comprises determining that a new component variant is not interchangeable with an old component variant, and forming a new assembly variant corresponding to the new component variant.

5. A system comprising:
   a product configuration system including a hierarchical node structure representing variants of a configurable product, the variants having selection conditions associated therewith relating to a determination of when the variants are to be included in a configurable product;
   a relationship database including relationship information concerning at least one of physical connections and functional relationships among the variants;
   an interface between the product configuration system and the relationship database for communicating the relationship information to the product configuration system; and
   computer-executable instructions to automatically generate assembly variants corresponding to combinations of component variants based on the relationship information;
   wherein the computer-executable instructions are further adapted to automatically generate selection conditions corresponding to the assembly variants based on selection conditions associated with the component variants.

6. The system of claim 5, wherein the relationship database is part of a computer-aided design system.

7. A method comprising:
   based on relationship information concerning at least one of physical connections and functional relationships among variants of components, automatically determining what variants of an assembly of the components are possible; and
   for each variant of the assembly, forming assembly selection conditions, the assembly selection conditions relating to a determination of when the assembly variants are to be included in a configurable product;

wherein the assembly selection conditions are a concatenation of component selection conditions, the component selection conditions relating to a determination of when the component variants are to be included in a configurable product; and wherein the concatenation is a linking of the component selection conditions by AND operators.

8. A system for generating selection conditions associated with variants represented in a hierarchical node structure in a product configuration system, the selection conditions relating to a determination of when the variants are to be included in a configurable product, the system comprising:

a memory containing computer-executable instructions; and a processor coupled to the memory to execute the instructions, the instructions when executed performing a process comprising:
- (a) receiving relationship information for component variants at a first node level of the node structure;
- (b) determining what combinations may be formed from the component variants based on the relationship information;
- (c) forming assembly variants corresponding to the combinations, at a second node level higher than the first node level; and
- (d) automatically forming selection conditions corresponding to the assembly variants based on selection conditions corresponding to the component variants.

9. The system of claim 8, wherein the relationship information is provided in a computer-aided design engineering database.

10. The system of claim 8, wherein (d) comprises combining the selection conditions corresponding to the component variants.

11. A machine-readable medium storing computer-executable instructions for performing a method for generating selection conditions associated with variants represented in a hierarchical node structure in a product configuration system, the method comprising:
- (a) receiving relationship information for component variants at a first node level of the node structure;
- (b) determining what combinations may be formed from the component variants based on the relationship information;
- (c) forming assembly variants corresponding to the combinations, at a second node level higher than the first node level; and
- (d) automatically forming selection conditions corresponding to the assembly variants based on selection conditions corresponding to the component variants.

12. The machine-readable medium of claim 11, wherein (d) comprises combining the selection conditions corresponding to the component variants.

13. A method for automatically propagating change information associated with variants represented in a hierarchical node structure in a product configuration system, the method comprising:
- (a) receiving change information for component variants at a first node level of the node structure, the change information relating to a replacement of a first component variant with a second component variant and including information relating to compatibility of the first component variant with the second component variant; and
- (b) based on the compatibility information, determining whether a new assembly variant corresponding to the second component variant needs to be formed, at a second node level higher than the first node level.

14. The method of claim 13, wherein the change information is provided in a computer-aided design engineering database.

15. The method of claim 14, further comprising propagating a change number that correlates the second component variant with a corresponding component variant in the new assembly variant, and a change date and/or time specifying when the replacement becomes effective, from the first node level to the second node level.

16. The method of claim 13, wherein (b) further comprises:

if the compatibility information indicates that the second component variant is not interchangeable with the first component variant, forming a new assembly variant corresponding to the second component variant.

17. The method of claim 13, wherein (b) comprises determining that a new assembly variant corresponding to the second component variant need not be created if the first component variant and the second component variant are compatible.

* * * * *